United States Patent
Ishihara et al.

[11] Patent Number: 5,805,380
[45] Date of Patent: Sep. 8, 1998

[54] OVERCOAT MAGNETIC HEAD SLIDER HAVING OVERCOAT AND MAGNETIC DISK DEVICE

[75] Inventors: Yuji Ishihara; Fujio Maeda; Hiroshi Kawahara, all of Tokyo, Japan

[73] Assignee: NEC Corporation, Tokyo, Japan

[21] Appl. No.: 791,550

[22] Filed: Jan. 31, 1997

[30] Foreign Application Priority Data

Jan. 31, 1996 [JP] Japan ................................ 8-015006

[51] Int. Cl.$^6$ .............................. G11B 5/255; G11B 5/71
[52] U.S. Cl. ........................................................... 360/103
[58] Field of Search .................................. 360/103, 102, 360/126, 122

[56] References Cited

U.S. PATENT DOCUMENTS

| | | | |
|---|---|---|---|
| 5,159,508 | 10/1992 | Grill et al. | 360/103 |
| 5,175,658 | 12/1992 | Chang et al. | 360/103 |
| 5,336,550 | 8/1994 | Ganapathi et al. | 360/120 X |
| 5,654,850 | 8/1997 | Ganapathi et al. | 360/103 |

FOREIGN PATENT DOCUMENTS 4364217  12/1992  Japan .

OTHER PUBLICATIONS

F. d'Heurle et al, "Silicon Nitride Protection for Magnetic Heads", *IBM Technical Disclosure Bulletin*, vol. 19, No. 1, Jun. 1976, p. 351.

G. Kaus et al, "Sliders for Magnetic Heads of Surface–Hardened Silicon with Integrated Electronic Components", *IBM Technical Disclosure Bulletin*, vol. 25, No. 7A, Dec. 1982.

*Primary Examiner*—John H. Wolff
*Attorney, Agent, or Firm*—Sughrue, Mion, Zinn, Macpeak & Seas, PLLC

[57] ABSTRACT

An overcoat for sufficiently preventing mechanical wear of a magnetic head slider caused by contact with a magnetic record medium is provided in a thin film head of a magnetic disk device.

The magnetic head slider is provided with the overcoat constituted by a film including two layers of a silicon layer that is an adhesive layer and a diamond-like carbon layer that is a protective layer and the silicon layer includes nitrogen component. Further, nitrogen concentration of the silicon layer 2 ranges from 1 through 57%.

The thickness of the silicon layer ranges from 5 through 300 angstroms and the thickness of the carbon layer ranges from 10 through 500 angstroms.

11 Claims, 3 Drawing Sheets

FIG.3

|  | INCREASE IN STATIC FRICTION COEFFICIENT | INCREASE IN DYNAMIC FRICTION COEFFICIENT |
|---|---|---|
| EMBODIMENT 1 | 0.20 | 0.35 |
| EMBODIMENT 2 | 0.17 | 0.39 |
| EMBODIMENT 3 | 0.28 | 0.37 |
| COMPARATIVE EXAMPLE | 0.52 | 0.65 |

FIG.4 PRIOR ART

|  | INCREASE IN STATIC FRICTION COEFFICIENT | INCREASE IN DYNAMIC FRICTION COEFFICIENT |
|---|---|---|
| CONVENTIONAL EXAMPLE | 0.41 | 0.59 |

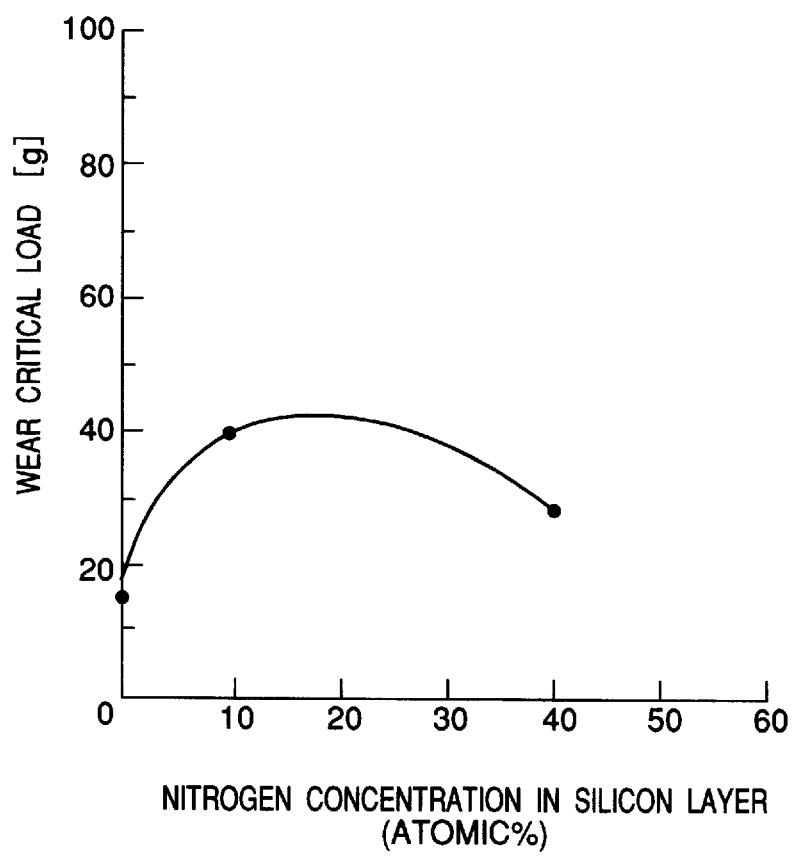

OVERCOAT MAGNETIC HEAD SLIDER HAVING OVERCOAT AND MAGNETIC DISK DEVICE

BACKGROUND OF THE INVENTION

The present invention relates to a magnetic head slider, and more particularly to a thin film magnetic head including a magnetic head of a magnetoresistive element type, a magnetic disk device mounted with a thin film magnetic head and fabrication of a magnetic head slider.

A magnetic head is made by forming a well-known magneto-electric transducer necessary for reading and writing information of a magnetic film on a magnetic record medium by piling up layers of magnetic material and electrically insulating material on a nonmagnetic substrate. A conductive pattern bonded with conductive slender leads for supplying applied current from outside, is formed in the magneto-electric transducer by a process similar to that of the magneto-electric transducer. Thereafter, the substrate is cut whereby a row of magnetic heads arranged in one row (hereinafter, row) is finished. Under this state the magnetic head is lapped (a kind of polishing) to constitute a dimension of a predetermined throat height (a height of a narrow gap magnetic path of a thin film magnetic head necessary for efficiently reading and writing data).

Thereafter, a rail pattern is formed on the lapped face by which a slider is formed. In forming the rail, other than a conventionally used mechanical working process, a dry fabrication process such as an etching process is also used since the shape of the rail becomes more complicated recently. Next, the material is divided into individual respective magnetic head sliders by a mechanical working process.

According to a magnetic disk device, the CSS (Contact Start Stop) system where a magnetic head is floated while rubbing a magnetic record medium in starting to rotate a disk and is stopped while rubbing the medium in stopping to rotate the disk, is frequently adopted.

Further, a magnetic head slider is designed to float while maintaining a narrow uniform interval (ordinarily, several tens nanometers) between a magnetic head and a magnetic record medium. However, even in the normal operation, the magnetic head and the magnetic record medium may accidentally be brought in contact with each other.

According to the conventional technology, various overcoats are piled up on a magnetic head slider to protect the slider against mechanical wear caused by friction or contact between the magnetic head and the magnetic record medium.

IBM Technical Disclosure Bulletin (TDB), December, 1982, page 3173, discloses a magnetic head slider having an overcoat of silicon carbide or diamond-like carbon. The thickness of the protective layer ranges from 500 to 1000 angstroms.

IBM (TDB), June, 1976, page 351, discloses a magnetic head having an overcoat of silicon nitride with the thickness of approximately 200 through 5000 angstroms.

However, an experiment revealed that when a silicon carbide film or a diamond-like carbon film having a film thickness of 500 angstroms was deposited directly on alumina-titanium carbide that is generally used as a material for a head slider, the adhesive force was not sufficiently provided and the film was liable to peal off due to stresses of the deposited film. Further, when the silicon nitride film by itself was used, the adhesive force was small and the mechanical durability was insufficient. Hence, the following overcoat having a two-layer structure combined with an adhesive layer has been proposed to improve these drawbacks.

Japanese Patent Laid-open No. Hei 4-364217 discloses a magnetic head slider having an overcoat comprising two layers of an adhesive layer of an amorphous silicon layer having a thickness of approximately 10 through 50 angstroms and a protective layer of a hydrogenated carbon layer. The sum of the film thickness of the layers of the overcoat is rendered 250 angstroms or less to avoid an increase in the spacing between a head and a medium.

FIG. 4 indicates a result of investigation as an embodiment of Japanese Patent Laid-open No. Hei 4-364217 in respect of increases in the friction coefficients after conducting 20,000 times of the CSS test concerning a magnetic head slider having an overcoat (overcoat A) comprising an amorphous silicon layer with the film thickness of 50 angstroms and a hydrogenated diamond-like carbon layer with the thickness of 50 angstroms. As indicated in FIG. 4, both the static friction coefficient and the dynamic friction coefficient increase considerably and the effect as an overcoat of a slider is insufficient. Further, according to a continuous seek test that is an index of operational durability of a magnetic disk device, significant wear of an overcoat of a slider was observed at the trailing portion of the slider where a magneto-electric transducer was disposed. Furthermore, with respect to the scratch durability of the overcoat, the critical load was as small as 15 gram.

As described above, according to the conventional examples, various overcoats are piled up on a magnetic head slider to protect the slider against mechanical wear caused by friction or contact between a magnetic head and a magnetic record medium.

However, it was found that according to the overcoats of the conventional examples, the durability sufficient for protecting the magnetic heads against mechanical wear was not provided and wear or exfoliation was caused in the overcoats whereby the magnetic heads were damaged.

A magnetic head is damaged by the mechanical wear caused by the contact between the magnetic head and a magnetic record medium which gives rise to deterioration in the life of the magnetic head. However, sufficient durability was not achieved in the overcoats of a slider of the conventional examples for protecting the slider against the mechanical wear.

SUMMARY OF THE INVENTION

It is an object of the present invention to promote the reliability of a magnetic head and a magnetic disk device by protecting the head by an overcoat having high durability.

An overcoat according to the present invention is a film for protecting an air bearing surface of a magnetic head slider opposed to a magnetic disk medium, wherein the overcoat comprises at least two layers of a silicon layer and a carbon layer and the silicon layer includes nitrogen component.

According to the overcoat of the present invention, the silicon layer includes 1 through 57 percent of nitrogen.

A magnetic head slider according to the present invention is a magnetic head slider having an overcoat at an air bearing surface opposed to a magnetic disk medium, wherein the overcoat comprises at least two layers of a silicon layer in close contact with a floating face of the magnetic head slider and a carbon layer in close contact with the silicon layer and the silicon layer includes nitrogen component.

According to the magnetic head slider of the present invention, the silicon layer includes 1 thorough 57 percent of nitrogen.

A magnetic disk device of the present invention is mounted with the magnetic head slider described above.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 3 is a diagram indicating values of increases in the friction coefficients after the CSS test of 20,000 times in respect of the magnetic head slider having the overcoat according to the present invention;

FIG. 4 is a diagram indicating values of increases in the friction coefficients after the CSS test of 20,000 times of a magnetic head slider having an overcoat in accordance with a conventional example; and FIG. 5 is a diagram showing a relation between wear critical load of an overcoat and nitrogen concentration of an adhesive layer according to other embodiment of the present invention.

DESCRIPTION OF THE PREFERRED EMBODIMENTS

Figure 1:
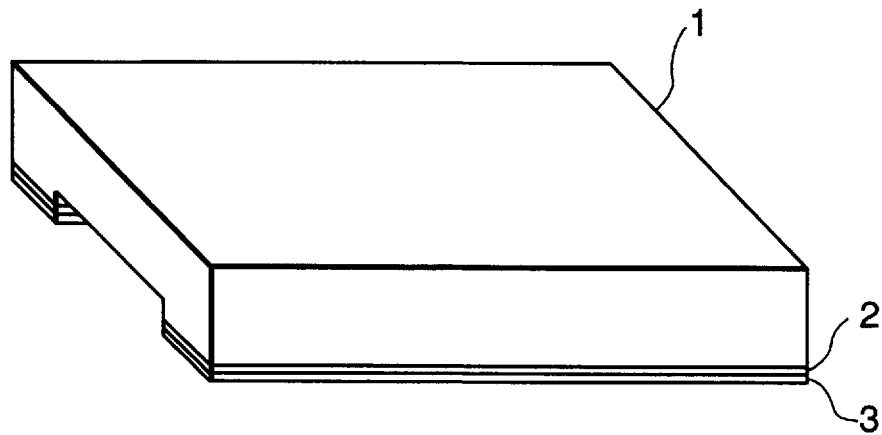
FIG. 1 is a perspective view showing the structure of a magnetic head slider having an overcoat in accordance with the present invention.

FIG. 1 shows an embodiment of the present invention that is applied to a thin film magnetic head.

A well-known magneto-electric transducer that is necessary for reading and writing information of a magnetic film on a magnetic record medium is formed on a magnetic head by piling up layers of magnetic material and electrically insulating material on a monomagnetic substrate. In this way, a plurality of heads are formed constituting a series of rows on the nonmagnetic substrate. In this case a conductive pattern bonded with conductive slender leads for supplying applied current from outside is formed on the magneto-electric transducer by a process similar to that for the magneto-electric transducer. When the substrate is cut thereafter, a row arranged with one row of magnetic heads is finished. Under this state, the magnetic heads are lapped to constitute a dimension of a predetermined throat height. A slider is formed thereafter by constituting a rail pattern on the lapped face. The rail pattern is formed by using a conventionally used mechanical working process or a dry fabrication process such as an etching process or the like thereby constituting an air bearing surface (ABS) on the slider. Next, the row of magnetic heads is divided into individual respective magnetic head sliders whereby the magnetic head is finished. A nitrogenated silicon layer 2 that is an adhesive layer is firstly piled on the ABS or the magnetic head slider 1 and an overcoat comprising a carbon layer 3 that is a protective layer is secondarily piled up thereon to protect a slider against mechanical wear caused by friction or contact. The step of piling up is executed under the state of the row that has been lapped or under the state of the slider that is divided from the row.

In this way, the magnetic head slider shown by FIG. 1 is fabricated.

Three embodiments in accordance with the present invention will be shown below. In either of the three embodiments an overcoat comprises a laminated film of a nitrogenated silicon film (film thickness; 20 angstroms) and a diamond-like carbon film (hereinafter, referred to as DLC, the film thickness is 80 angstroms in Embodiments 1, 2 and 3). The silicon film is formed by a sputtering process and the carbon film is formed by a sputtering process or a CVD process (Chemical Vapor Deposition process). The nitrogen contents in the silicon films as adhesive layers are 50% (hereinafter, "Embodiment 1"), 26% (hereinafter, "Embodiment 2"), 1% (hereinafter, "Embodiment 3") and 0% (hereinafter, "Comparative Example").

FIG. 3 shows increases in the friction coefficients after 20,000 times of the CSS test in respect of head sliders respectively having overcoats of Embodiments 1, 2 and 3 and Comparative Example.

As indicated in FIG. 3, increases in both of the static friction coefficient and the dynamic friction coefficient are small in Embodiments 1, 2 and 3 according to the present invention in comparison with those in Comparative Example shown by FIG. 4, thereby showing an excellent CSS characteristic. By contrast, the increase is considerable and the CSS characteristic is made worse in Comparative Example.

Also, a continuous seek test that is an index of the life of device was carried out by mounting the sliders respectively deposited with the overcoats of Embodiments 1, 2 and 3 and Comparative Example on a magnetic disk device. Although the wear of the overcoats of the sliders was not observed in the respectives of Embodiments 1, 2 and 3 significant wear was recognized on the slider face in Comparative Example, after testing for 96 hours.

Figure 2:
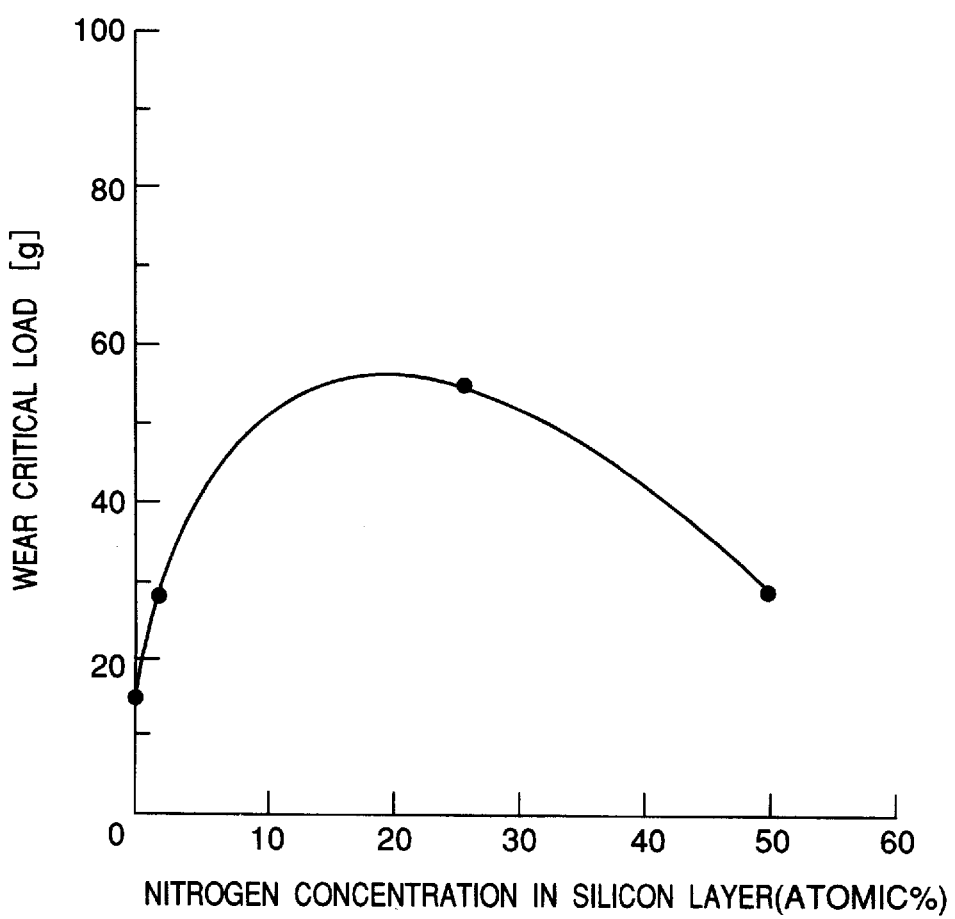
FIG. 2 is a diagram showing a relation between wear critical load of the overcoat and nitrogen concentration of an adhesive layer.

FIG. 2 indicates the scratch durability of Embodiments 1, 2 and 3. According to FIG. 2, a minimum load by which an indentation remains in the film when the film is marked by a diamond stylus having a front end radius of 50 micrometer at a speed of 3.3 m per second, is defined as the wear critical load and the wear critical load is plotted against nitrogen concentration in the silicon film. The wear critical load is as small as 15 gram in respect of Conventional Example having 0% of the nitrogen content in the silicon film, whereas the durability is promoted when nitrogen is included in the silicon film. Especially, when the nitrogen content in the silicon film is 26%, the wear critical load is provided with a maximum value of 55 gram showing a significant effect. Further, when nitrogen is included to exceed the stoichiometric composition (4 of nitrogen atoms versus 3 of silicon atoms, nitrogen content; 57%) of the silicon nitride film, the film becomes fragile. Therefore, the nitrogen content is preferably 1% or more and 57% or less.

The magnetic head may be made worse by corrosion due to constituents composing the atmosphere other than the mechanical wear. The effect of protecting the magnetic head against corrosion was recognized even with an overcoat having the thickness of approximately 100 angstroms in the embodiments of the present invention.

According to a magnetic disk device, not illustrated, where a slider coated with the nitrogenated silicon film and the carbon film as shown by FIG. 1 was mounted, there caused no trouble that was bound for deterioration in the tribological performance or head clash whereby the life of device was improved.

Further, according to the above-described embodiments, an explanation has been given of only the cases of the nitrogenated silicon film having the film thickness of 20 angstroms and the diamond-like carbon film having the film thickness of 80 angstroms. In addition thereto, as another embodiment of the present invention, an overcoat comprised a laminated film of a nitrogenated silicon layer having the film thickness of 50 angstroms and a diamond-like carbon layer having the film thickness of 50 angstroms. As shown by FIG. 5, the wear critical load of the overcoat according to the present invention where nitrogen was included in the silicon film, was large and the durability was promoted in comparison with the conventional example where the nitrogen content in the silicon film was 0% by which an effect similar to those in the Embodiments 1, 2 and 3 was achieved.

Additionally, an effect similar to those in the above-described embodiments was achieved even with a $SiN_x$ film having the film thickness of 5 through 300 angstroms and a DLC film having the film thickness of 10 through 500 angstroms, in a range of the nitrogen content of the SiNx film of 1% or more and 57% or less.

As has been explained, according to the overcoat of the magnetic head slider of the present invention, the adhesion performance of the protective layer in respect of the DLC film and the strength thereof are significantly promoted by prescribing the nitrogen content of the adhesive layer of the $SiN_x$ film to 1% or more and 57% or less by which the magnetic head can be protected against friction or wear when it is used in a magnetic disk device.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An overcoat for protecting an air bearing surface of a magnetic head slider opposed to a magnetic disk medium;
    wherein said overcoat comprises:
        a silicon layers and
        a carbon layer formed on said silicon layer, said carbon layer being opposed to said magnetic disk medium, wherein said silicon layer includes nitrogen component.

2. An overcoat according to claim 1, wherein said silicon layer includes 1 through 57% of nitrogen.

3. An overcoat according to claim 1 or claim 2, wherein said silicon layer is formed by a sputtering process and said carbon layer is formed by a sputtering process and a chemical vapor deposition (CVD) process.

4. An overcoat according to claim 1 or claim 2, wherein thickness of said silicon layer ranges from 5 through 300 angstroms and thickness of said carbon layer ranges from 10 through 500 angstroms.

5. An overcoat according to claim 1 or claim 2, wherein thickness of said silicon layer ranges from 20 through 50 angstroms and thickness of said carbon layer ranges from 50 through 80 angstroms.

6. A magnetic disk medium having an overcoat on an air bearing surface opposed to a magnetic disk medium;
    wherein said overcoat comprises:
        a silicon layer in close contact with a floating face of a magnetic head slider; and
        a carbon layer formed on said silicon layer; said carbon layer being opposed to said magnetic disk medium, wherein said silicon layer includes nitrogen component.

7. A magnetic head slider according to claim 6, wherein said silicon layer includes 1 through 57% of nitrogen.

8. A magnetic disk device mounted with the magnetic head slider of claim 6 or claim 7.

9. A magnetic head slider according to claim 6 or claim 7, wherein said silicon layer is formed by a sputtering process and said carbon layer is formed by a sputtering process and a chemical vapor deposition (CVD) process.

10. A magnetic head slider according to claim 6 or claim 7, wherein thickness of said silicon layer ranges from 5 through 300 angstroms and thickness of said carbon layer ranges from 10 through 500 angstroms.

11. A magnetic head slider according to claim 6 or claim 7, wherein a thickness of said silicon layer ranges from 20 through 50 angstroms and a thickness of said carbon layer ranges from 50 through 80 angstroms.

* * * * *